United States Patent
Cromwell et al.

[11] Patent Number: 6,061,235
[45] Date of Patent: May 9, 2000

[54] METHOD AND APPARATUS FOR A MODULAR INTEGRATED APPARATUS FOR HEAT DISSIPATION, PROCESSOR INTEGRATION, ELECTRICAL INTERFACE, AND ELECTROMAGNETIC INTERFERENCE MANAGEMENT

[75] Inventors: S. Daniel Cromwell, Penryn, Calif.; Laszlo Nobi, Fort Collins, Colo.

[73] Assignee: Hewlett-Packard Company, Palo Alto, Calif.

[21] Appl. No.: 09/195,256

[22] Filed: Nov. 18, 1998

[51] Int. Cl.[7] ........................................................ H05K 7/20
[52] U.S. Cl. ......................... 361/690; 361/698; 361/699; 361/700; 361/704; 361/719; 361/818; 257/718; 257/719; 174/15.2; 174/35 R; 165/80.3; 165/80.4
[58] Field of Search .................................. 361/687–690, 361/699, 700, 702–704, 707, 709–713, 719, 720; 257/718, 719, 727; 174/16.1, 16.3; 165/80.2, 80.3, 80.4, 185

[56] References Cited

U.S. PATENT DOCUMENTS

| | | |
|---|---|---|
| 4,067,237 | 1/1978 | Arcella . |
| 4,120,019 | 10/1978 | Arii et al. . |
| 4,167,031 | 9/1979 | Patel . |
| 4,342,069 | 7/1982 | Link . |
| 4,376,560 | 3/1983 | Olsson et al. . |
| 4,506,938 | 3/1985 | Madden . |
| 4,638,854 | 1/1987 | Noren . |
| 4,675,783 | 6/1987 | Murase et al. . |
| 4,707,726 | 11/1987 | Tinder . |
| 4,829,432 | 5/1989 | Hershberger et al. . |
| 4,874,318 | 10/1989 | Spencer . |
| 4,922,376 | 5/1990 | Pommer et al. ............... 361/715 |
| 4,951,740 | 8/1990 | Peterson et al. . |
| 4,978,638 | 12/1990 | Buller et al. . |
| 5,060,112 | 10/1991 | Cocconi . |
| 5,068,493 | 11/1991 | Benn, Sr. et al. ............ 174/35 GC |
| 5,162,974 | 11/1992 | Currie . |
| 5,208,731 | 5/1993 | Blomquist . |
| 5,229,915 | 7/1993 | Ishibashi et al. . |
| 5,276,585 | 1/1994 | Smithers . |

(List continued on next page.)

OTHER PUBLICATIONS

F.J. DeMaine, et al., "Attachable Heat Sink For Pluggable Modules", IBM Technical Disclosure Bulletin, vol. 22—No. 3, Aug. 1979, pp. 960–961.

*Primary Examiner*—Leo P. Picard
*Assistant Examiner*—Boris L. Chervinsky

[57] ABSTRACT

A modular integrated apparatus and method that integrates mechanical, electrical, and thermal management, and that includes a computer processor (CPU), or VLSI module, connected to a circuit board and a thermal plate. The modular integrated apparatus includes a field replaceable apparatus and a receiving apparatus and attenuates EMI. By integrating mechanical, electrical, and thermal management features the modular integrated apparatus improves the process of repairing and upgrading the processor at a customer site by simplifying the modular integrated apparatus package. Additionally, by reducing the number of parts and the amount of circuit board space required to connect a processor to a thermal plate, the present embodiment improves ease of use and acts as a handle in its own installation and removal. Further, by including the processor and a heat sink in the field replaceable apparatus, the field replaceable apparatus reduces handling in the field and the risk of damage to the processor, and may be tested prior to installation in the field to ensure it operates properly.

7 Claims, 6 Drawing Sheets

U.S. PATENT DOCUMENTS

| | | |
|---|---|---|
| 5,307,239 | 4/1994 | McCarty et al. . |
| 5,313,099 | 5/1994 | Tata et al. . |
| 5,329,426 | 7/1994 | Villani . |
| 5,339,214 | 8/1994 | Nelson . |
| 5,357,404 | 10/1994 | Bright et al. ............................ 361/818 |
| 5,359,493 | 10/1994 | Chiu . |
| 5,367,193 | 11/1994 | Malladi . |
| 5,386,338 | 1/1995 | Jordan et al. . |
| 5,412,535 | 5/1995 | Chao et al. ............................ 361/700 |
| 5,428,897 | 7/1995 | Jordan et al. . |
| 5,461,766 | 10/1995 | Burward-Hoy . |
| 5,487,673 | 1/1996 | Hurtarte . |
| 5,504,650 | 4/1996 | Katsui et al. . |
| 5,508,908 | 4/1996 | Kazama et al. . |
| 5,513,070 | 4/1996 | Xie et al. . |
| 5,522,602 | 6/1996 | Kaplo et al. . |
| 5,579,827 | 12/1996 | Chung . |
| 5,586,005 | 12/1996 | Cipolla et al. . |
| 5,597,979 | 1/1997 | Courtney et al. ..................... 174/35 R |
| 5,598,320 | 1/1997 | Toedtman et al. . |
| 5,599,027 | 2/1997 | Balsells ................................. 277/163 |
| 5,632,158 | 5/1997 | Tajima ................................... 361/700 |
| 5,654,876 | 8/1997 | Sathe et al. ............................ 361/704 |
| 5,774,335 | 6/1998 | Pare et al. .............................. 361/704 |
| 5,917,703 | 6/1999 | Murphy .................................. 361/704 |

METHOD AND APPARATUS FOR A MODULAR INTEGRATED APPARATUS FOR HEAT DISSIPATION, PROCESSOR INTEGRATION, ELECTRICAL INTERFACE, AND ELECTROMAGNETIC INTERFERENCE MANAGEMENT

FIELD OF THE INVENTION

The present invention relates generally to a method and apparatus for integrated circuit packaging. More particularly, the present invention relates to a modular integrated apparatus that combines a computer processor and a heat dissipation device into a field replaceable package for connection to a printed circuit board that minimizes the thermal path and provides EMI attenuation.

DESCRIPTION OF RELATED ART

The following applications are related to the present application: U.S. Patent Application entitled, "A HEAT SINK AND FARADAY CAGE ASSEMBLY FOR A SEMICONDUCTOR MODULE AND A POWER CONVERTER," Ser. No. 08/902,770, naming inventor S. Daniel Cromwell, assigned to the assignee of the present invention and "METHOD AND APPARATUS FOR A MODULAR INTEGRATED APPARATUS FOR MULTI-FUNCTION COMPONENTS," naming inventor S. Daniel Cromwell, assigned to the assignee of the present invention.

BACKGROUND OF THE INVENTION

As the state of development of semiconductor components such as computer processor (CPU) modules has moved to increased levels of integration, the amount of heat these devices generate has significantly increased. For instance, processors handling large quantities of electrical current generate large amounts of heat. If this heat is not adequately dissipated, the increased temperatures produced by the semiconductor components will compromise their function and shorten their length of operation.

One approach for solving the growing heat dissipation problem is to attach components which transfer or dissipate heat by means of heat sinks. When the processor and the heat dissipation component are handled separately replacement of either component outside of the manufacturing environment is more difficult.

As heat sinks continue to increase significantly in size and weight to accommodate the increase of heat from processors the risk of damage to the processors due to mechanical overloading is increased. Therefore, there is an increasing need to manage the force that is created by the heat sink on the processor to minimize load conditions that could damage the processor.

When the processor and the heat dissipation component are handled as separate parts of a system, more particularly when the heat dissipation device must be subsequently added to the system, greater thermal and mechanical design margins are required to accommodate attachment of the independent parts. The separate approach to the heat management process increases the complexity of a computer system due to the need for additional system components, and thereby adversely impacts cost, and time to manufacture and repair. There is also a risk of quality problems associated with increased system complexity. Also, treating the processor and the heat sink separately precludes early testing of the processor and the heat sink which cannot be finally tested until they are assembled together.

Factors such as the increased integration levels and electrical connections on the processor increase the need for accurate alignment of the electrical connections on the circuit board. Further, the increased handling, transport, and use of the processor caused by the separate component design may increase the risk of contamination or other damage to the area grid array on a processor.

Further, maintaining separate units for a processor and a heat sink requires significant circuit board space since both modules require separate access during assembly and repair, resulting in large and expensive printed circuit boards. In these systems access to a processor is very difficult due to the size and crowding of the heat sinks on a circuit board.

The processor is an electrical component that requires shielding from electromagnetic (EMI) or radio frequency (RFI) interferences which it may generate. EMI and RFI will be referred to collectively herein as "EMI." Treating the processor and the heat sink as separate modules requires an EMI attenuation solution for the interface between the separate modules.

From the foregoing it will be apparent that there is still a need for a way to package heat sinks that adequately dissipate heat from processors while ensuring proper connection of the area grid array to the circuit board. There is a need for a package that minimizes the thermal path between the processor and the heat sink, and the space required on the circuit board for the processor and the heat sink. Further, there is a need to package heat sinks and processors without damaging the area grid array of the processor and without imposing mechanical stress on the processor that can lead to failure. There is also a need to minimize the number of parts required to provide the features of ease of installation, EMI containment, and heat management and thereby improve the repair and upgrade process, even at a customer site.

SUMMARY OF THE INVENTION

The present invention may be implemented as a modular integrated apparatus for a computer system that includes a field replaceable apparatus and a receiving apparatus, and may also function as a heat sink and attenuate EMI. The field replaceable apparatus may be installed, removed, and handled outside of the manufacturing environment without interrupting the thermal interface created in the manufacturing environment. Therefore, the present invention minimizes the thermal path between a processor and a heat sink. The field replaceable apparatus includes a processor and a heat sink, and attaches to a receiving apparatus thereby ensuring proper connection of the processor to a circuit board.

In the present invention the field replaceable apparatus may advantageously act as a handle for use in its own replacement. Further, the field replaceable apparatus can be assembled easily which simplifies the process of handling in the field. The field replaceable apparatus minimizes the number of parts required to provide the features of ease of installation, EMI containment, and heat management and thereby improves the repair and upgrade process, even at a customer site. By producing the field replaceable apparatus as one unit in the controlled manufacturing environment, final testing of the assembled heat sink and the processor can be completed in the manufacturing environment.

The field replaceable apparatus may also minimize the length of traces between electronic packages in a computer system by enabling the use of a tall design for the field replaceable apparatus with a minimum circuit board footprint, or surface area. This improves the performance of the overall system while reducing its size.

The modular integrated apparatus minimizes contamination of the circuit board and the area grid array of the processor by minimizing the number of parts in the field replaceable apparatus while providing a means to reduce contamination. Further, the modular integrated apparatus attenuates EMI from the processor by including an enclosure for the processor.

The receiving apparatus may include a CPU anchor bracket, an anchor dust cover, and the circuit board. The anchor bracket functions as a docking housing that is mounted on the circuit board. The field replaceable apparatus and the receiving apparatus cooperate to ensure that the processor is positioned for proper connection to the circuit board by aligning and orienting the field replaceable apparatus for attachment to the receiving apparatus. The anchor bracket also attenuates EMI. It will be appreciated that the anchor dust cover of the receiving apparatus will reduce contamination from debris during handling and operation of the computer system.

The field replaceable apparatus includes a heat sink having a thermal plate attached to a support base. The processor is positioned with respect to the support base at a pre-determined position that ensures proper alignment to the anchor bracket and the circuit board, and thereby ensures proper connection of the processor to the circuit board. The processor interfaces to the thermal plate thereby facilitating the thermal interface between the processor and the thermal plate. The connection of the processor to the thermal plate may be facilitated by including a socket frame that encases the processor and is attached to the support base. Further, a thermal interface material positioned between the processor and the thermal plate in a manner well known in the art may facilitate the thermal connection of the processor to the thermal plate.

The field replaceable apparatus may include at least one heat pipe that is connected to the thermal plate and, by means well known in the art, thermally communicates with the thermal plate to divert heat for more efficient heat management. Also, the field replaceable apparatus may include at least one heat fin that is located adjacent to the thermal plate and is connected to the heat pipe, thereby enabling the heat fin to dissipate heat originating from the processor. The heat sink may include a top cover attached to the heat fins, and a side sleeve. The side sleeve is an inverted U-shape that covers the top and two opposite sides of the heat fins, and is attached to the support base. Further, the side sleeve is properly oriented and positioned with respect to the support base to ensure proper orientation of the top cover with respect to the field replaceable apparatus. The top cover and the side sleeve also provide structural support and protection for elements of the field replaceable apparatus such the heat sink.

The field replaceable apparatus also includes a modular processor apparatus that includes the processor, a land grid array interposer socket, a socket frame, and a processor dust cover. The land grid array interposer socket requires careful load management in the modular processor apparatus and careful alignment of the connections between the land grid array of the processor and of the circuit board. The present invention manages the load imposed by the attachment of the field replaceable apparatus to the receiving apparatus on the interposer sockets. Advantageously, the present invention may include the socket frame that is attached to the heat sink and that surrounds the processor without requiring the fixed attachment of the processor. Thereby the socket frame supports the processor and facilitates connection of the processor to the thermal plate. Further, the socket frame encases the processor for proper electrical connection to the interposer sockets. Subsequently, when the field replaceable apparatus is attached to the receiving apparatus the aligned and connected processor and interposer sockets complete the electrical connection with the land grid array of the circuit board. The processor dust cover protects the processor during handling and is removed when the field replaceable apparatus is attached to the receiving apparatus. Further, an optional EMI gasket, which is a member of the heat sink, may form a perimeter around the socket frame and abut the support base, thereby attenuating EMI from the processor by creating a continuous electric path between the support base and the anchor bracket.

The advantageous features of the field replaceable apparatus, including acting as a handle for use in its own replacement and enabling maintenance cost savings over past packaging designs, are not limited to the inclusion of the heat sink in the field replaceable apparatus and may be realized by the use of a non-thermal component in place of or along with the heat sink. Further it will be appreciated that the field replaceable apparatus may function without the top cover and side sleeve.

The present invention may be implemented as a method of creating a modular integrated apparatus as described above. The method may include creating a field replaceable apparatus and a receiving apparatus that may function as a heat management device and may attenuate EMI.

The present invention may be implemented as an easy-to-use, modular integrated apparatus that includes a processor connected to a heat sink that functions as a handle for its own removal and insertion and that minimizes the thermal path and attenuates EMI. Further, the difficult task of properly connecting the processor and the printed circuit board is accomplished by employing the alignment features of the modular integrated apparatus.

Other aspects and advantages of the present invention will become apparent from the following detailed description, taken in conjunction with the accompanying drawings, illustrating by way of example the principles of the present invention.

DETAILED DESCRIPTION

Figure 1A:
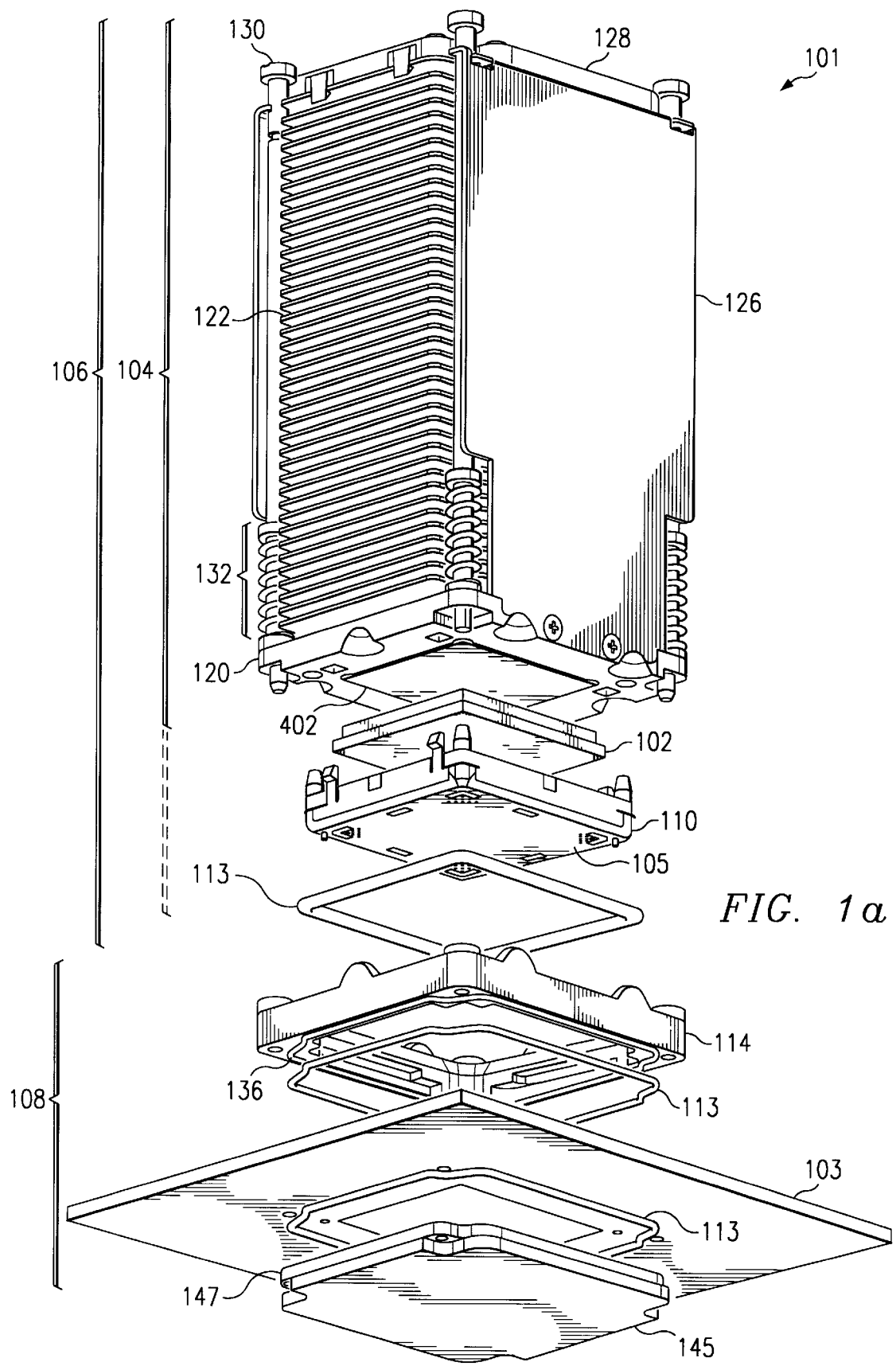
FIG. 1a is a view of the modular integrated apparatus according to one aspect of the invention, including the heat sink.

In the following detailed description and in the several figures of the drawings, like elements are identified with like reference numerals.

Broadly stated, FIG. 1a illustrates a modular integrated apparatus 101 for a computer system that includes a processor 102 that is connected to a heat sink 104 that adequately dissipates heat from the processor 102 while ensuring proper connection of the processor 102 to a circuit board 103. The processor 102 and heat sink 104 are packaged in a field replaceable apparatus 106 without damaging the land grid array substrate of the processor 102 and without imposing excessive mechanical stress on the processor 102 that can lead to failure. The field replaceable apparatus 106 minimizes the thermal path between the processor 102 and the heat sink 104, and the space required on the circuit board 103 for the processor 102 and the heat sink 104. The modular integrated apparatus 101 reduces the number of parts required in the easy-to-use package that may be installed and removed even at a customer site.

It will be appreciated that the processor 102 may be a multi-chip module or a single VLSI package. For instance the VLSI package may be a flip chip assembly as is well known in the art. Also, typically the land grid array may implement a compression assembly technique in which at least one land grid assembly interposer socket 105 is sandwiched between the land grid array of the processor 102 and the land grid array of the circuit board 103. Further, reference to a circuit board 103 may include a printed circuit board such as a mother board.

In the present embodiment, the modular integrated apparatus 101 includes the field replaceable apparatus 106 and a receiving apparatus 108. The field replaceable apparatus 106 includes a modular processor apparatus 414, the heat sink 104 including a thermal plate 402, a support base 120, a plurality of heat fins 122, a heat pipe 124 (as shown in FIG. 4b), a plurality of anchor screws 130 with a plurality of compression and load management assemblies 132, a top cover 128, a side sleeve 126, and an optional EMI gasket 113. The modular processor apparatus 414 (as shown in FIG. 4b) includes the processor 102, a socket frame 110, the interposer sockets 105, and a processor dust cover 112 that is discussed with reference to FIG. 1c. Further, the field replaceable apparatus 106 is located and positioned for proper connection to a receiving apparatus 108.

In the present embodiment, the receiving apparatus 108 includes the circuit board 103 that is attached to an anchor bracket 114. Further, in the present embodiment the primary electric power is available via the circuit board 103. The receiving apparatus 108 may include the EMI gasket 113, and an anchor dust cover 118 that is discussed with reference to FIG. 1d. Optionally, the receiving apparatus 108 may include a bolster plate 145 and a bolster insulator 147. When the receiving apparatus 108 and the field replaceable apparatus 106 are connected, they form the modular integrated apparatus 101. Further, when the modular integrated apparatus 101 is assembled, the anchor bracket 114 circumscribes and is adjacent to the processor 102, thereby facilitating connection of the processor 102 to the circuit board 103. The anchor bracket 114 abuts the support base 120.

The attachment of the anchor bracket 114 to the circuit board 103 may be by any well known technique such as with screws threaded into anchor bracket sockets 306 that are discussed with reference to FIG. 3. It will be appreciated that the use of screws and sockets herein may be substituted by a variety of other attachment techniques that are well-known in the art. Also, mechanical sockets that receive screws are distinguished herein from electrical sockets that receive electrical connections.

The receiving apparatus 108 may optionally include a bolster plate 145 that is attached to the circuit board 103 and may provide stability to the circuit board 103. The term bolster plate herein refers to a sheet that provides stability and support for the circuit board 103 when loaded and may be shaped in a variety of ways. For instance, the bolster plate may have a cavity or may have a shape similar to the anchor bracket 114. The bolster plate 145 may attenuate EMI when electrical components on the circuit board 103 such as by-pass capacitors and resisters are positioned within the perimeter of the bolster plate 145. Further the bolster plate 145 may be attached to a bolster insulator 147 that insulates the circuit board 103 and the bolster plate 145.

The anchor bracket 114 also helps support the field replaceable apparatus 106 and distributes the weight load created on the circuit board 103 by the attachment of the field replaceable apparatus 106 to the receiving apparatus 108. It will be appreciated that the anchor bracket 114 may be made of metal, metal coated plastic, or metal impregnated plastic when EMI containment is required. Further, an electrically compliant material such as the EMI gasket 113 may be sandwiched between the anchor bracket 114 and the support base 120 or the anchor bracket 114 and the circuit board 103 when the modular integrated apparatus 101 is assembled, thereby attenuating EMI that may be emitted from the processor 102 or components on the circuit board 103. In the present embodiment, the EMI gasket 113 is an extruded hollow, electrically conductive, compliant gasket formed in an O-ring.

When the anchor bracket 114 includes metal in its composition it may, by its connection to the heat sink 104 via the EMI gasket 113 and by its mounting on the circuit board 103, attenuate EMI from the processor 102. The connection of the EMI gasket 113 may be facilitated by an EMI groove 136 in the support base 120 (not shown) or the anchor bracket 114. As is well known in the art, by inserting a compliant, electrically conductive material in the EMI groove 136, a tight connection that attenuates EMI is made between the support base 120 and the anchor bracket 114, and the anchor bracket 114 and the circuit board 103. For example, the product marketed under the trademark CHO-FORM™ is an electrically conductive, compliant caulk-like substance that may be dispensed on a base such as the EMI groove 136 to attenuate EMI. Alternatively, a ribbon of electrically conductive material such as a product marketed under the trademark SPIRA™ may be used in the EMI groove 136. Occasionally, the bolster plate may also be used to reduce unnecessary EMI.

The controlled process of mounting the anchor bracket 114 to the circuit board 103 in a manufacturing environment ensures the alignment of the receiving apparatus 108 for attachment to the field replaceable apparatus 106. The alignment ensures that components of the receiving apparatus 108 and the field replaceable apparatus 106 are properly oriented for proper connection of the interposer socket 105 to the land grid array of the circuit board 103.

The modular processor apparatus 414 is packaged to ensure that the thermal plate 402 and the processor 102 connect with an optimal thermal interface. In the present embodiment a thermal interface material (not shown) is an easy to use pad that is placed between the processor 102 and the thermal plate 402 as discussed with reference to FIG. 4a. The processor 102 fits into the socket frame 110, which forms a perimeter around the processor 102 and is also discussed with reference to FIG. 4a. Further the socket frame 110 connects to the support base 120 thereby enabling the processor 102 to be located adjacent to the thermal plate 402. The interposer sockets 105 are located on the side of the socket frame 110 opposite to the side connected to the support base 120, so that the interposer sockets 105 may connect to the land grid array of the circuit board 103.

The field replaceable apparatus 106 includes the heat sink 104 that manages heat generated by the processor 102. The heat sink 104 includes the support base 120 that is connected to the modular processor apparatus 414. The heat sink 104 also includes the thermal plate 402 that is connected to the processor 102. When a clean, flat, and smooth surface exists between the thermal plate 402 and the processor 102 they may be fitted together with a thermal enhancer (not shown), such as a thermal pad or thermal grease, to create a low resistance thermal path that ensures a proper operating temperature for the processor 102.

In the present embodiment, the heat pipe 124 (as shown in FIG. 4b) fits into a cavity that has been cut lengthwise into the heat fins 122, is connected to the thermal plate 120, and diverts heat from the processor 102 by moving heat to a space where there is sufficient air flow to cool the system. For instance, the heat sink 104 also includes a plurality of heat fins 122 that flank the thermal plate 402, that are attached to the heat pipe 124 thereby receiving heat from the heat pipe 124 by conduction, and that dissipate heat by convection to the surrounding air. Air may be forced through the computer system by means such as a fan and, by convection, dissipate heat on the large area of the heat fins 122.

It will be appreciated that heat management may also be required to raise the temperature of components in a computer system to a level required for proper operation. Further, the use of the term heat sink 104 herein includes all forms of heat dissipation devices such as fins and heat pipes, and "heat sink" and "heat management device" will be used interchangeably herein.

The present embodiment of the side sleeve 126 is an inverted U-shape and may be metal and thereby provide support for elements of the field replaceable apparatus 106. The bottom edges of the side sleeve 126 are attached to the support base 120 by screws threaded into support sockets 302 on the support base 120 and are discussed with reference to FIG. 3. The side sleeve 126 may cover the top of the heat sink 104 and two opposite lengthwise sides of the heat sink 104 in the orientation depicted in FIG. 1a. The top cover 128 is optional and may fit over the top of the heat fins 122 and the side sleeve 126, and adds support to the elements of the field replaceable apparatus 106.

In the present embodiment, the field replaceable apparatus 106 is attached to the receiving apparatus 108 by anchor screws 130 that cooperate with compression and load management assemblies 132 that manage the load on the processor 102 thereby enabling proper pressure to be applied to the interposer socket 105. Further, when the screws are set, compressing the compression and load management assemblies 132 to the necessary height, the load required to ensure proper socket function between the processor and the circuit board is established. It will be appreciated that typically the compression and load management assemblies 132 are only employed in conjunction with the anchor screws 130. The compression and load management assembly 132 may include a shoulder and a flange on the anchor screws 130 that cooperate to control the distance in which a spring may be compressed while tightening the anchor screws 130. Alternatively, the compression and load management assembly 132 may include a spring and spacer in which the distance for spring compression is controlled by the spacer height. Further, load management may be obtained by measuring the torque applied to the anchor screws 130 or by any other means well known in the art.

Returning to FIG. 1a, the anchor screws 130 extend alongside the top cover 128 and the heat fins 122, through the support base 120, and are secured to the anchor bracket 114 thereby attaching the receiving apparatus 108 to the field replaceable apparatus 106. It will be appreciated that the side sleeve 126 and the top cover 128 provide structural stability to the field replaceable apparatus 106, control the flow of air through the heat sink 104, and facilitate guidance of the anchor screws 130 alongside the heat fins 122 as depicted in FIG. 1a. Further, the attachment of the anchor screws 130 ensures proper electrical, mechanical, and EMI management of the modular integrated apparatus 101 by securing the field replaceable apparatus 106 to the receiving apparatus 108, and by applying proper load to the processor 102 and interposer sockets 105 (as are shown in FIG. 1a). In an alternative embodiment, the anchor screws 130 may be attached directly to the circuit board 103 in place of the attachment to the anchor bracket 114, and are described in greater detail with reference to FIG. 2b.

The thickness of any part of the modular integrated apparatus 101 may be determined by techniques well known in the art, and in the present embodiment the field replaceable apparatus 106 is in part a metallic alloy.

The modular integrated apparatus 101 attenuates EMI by means of the anchor bracket 114, the circuit board 103, the support base 120, and the EMI gasket 113. Further, the field replaceable apparatus 106 may function as a handle for use in its own replacement.

Figure 1B:
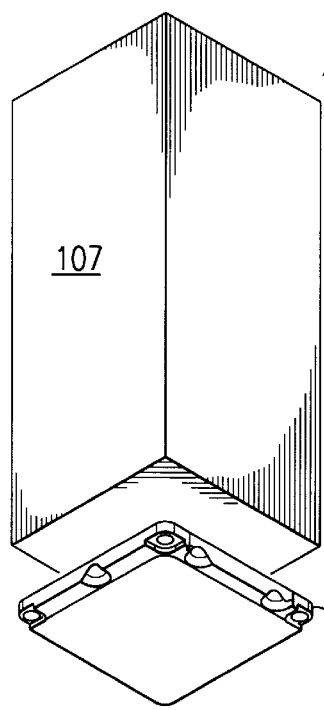
FIG. 1b is an alternate view of the modular integrated apparatus including the non-thermal component.

As shown in FIG. 1b the features of the field replaceable apparatus 106, including acting as a handle for use in its own replacement and enabling maintenance cost savings over past packaging designs, are not limited to the inclusion of the heat sink 104 (not shown) in the field replaceable apparatus 106 and may be realized by the use of a non-thermal component 107 in place of or along with the heat sink that is attached to the support base 120. The non-thermal component 107 may be a hollow metal brick that fills the space previously taken by the heat fins 122 (not shown) and the heat pipe 124 and acts as a handle and for air flow management.

Figure 1C:
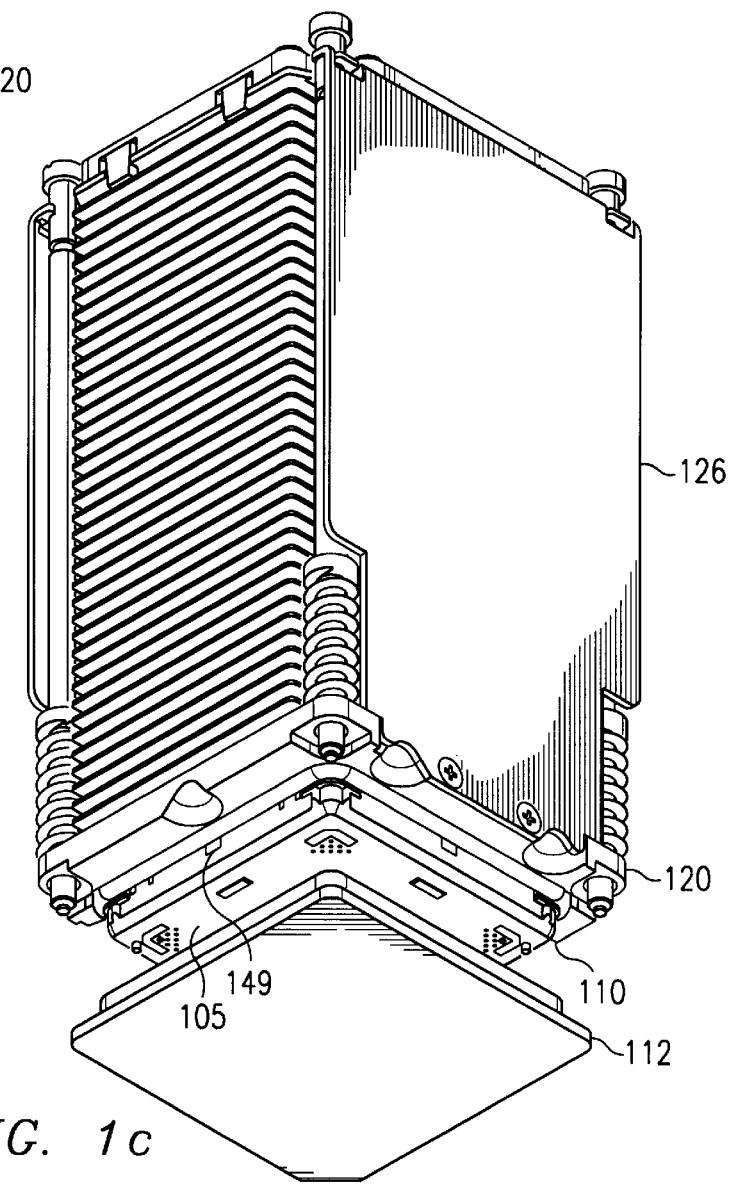
FIG. 1c is a perspective view of the processor dust cover.

As shown in FIG. 1c, in the present embodiment the processor dust cover 112 is a plastic molded cap that goes over one face of the socket frame 110. The processor dust cover 112 is made of plastic and may be attached to the socket frame 110 by snapping tabs into receiving pockets 149 on the socket frame 110. The processor dust cover 112 protects the interposer sockets 105 and enables attachment of the socket frame 110 to the support base 120 without handling the contacts on the interposer sockets 105. The processor dust cover 112 is removed when the field replaceable apparatus 106 is connected to the receiving apparatus 108 (as are shown in FIG. 1a) thereby enabling the connection of the interposer sockets 105 to the circuit board 103.

Figure 1D:
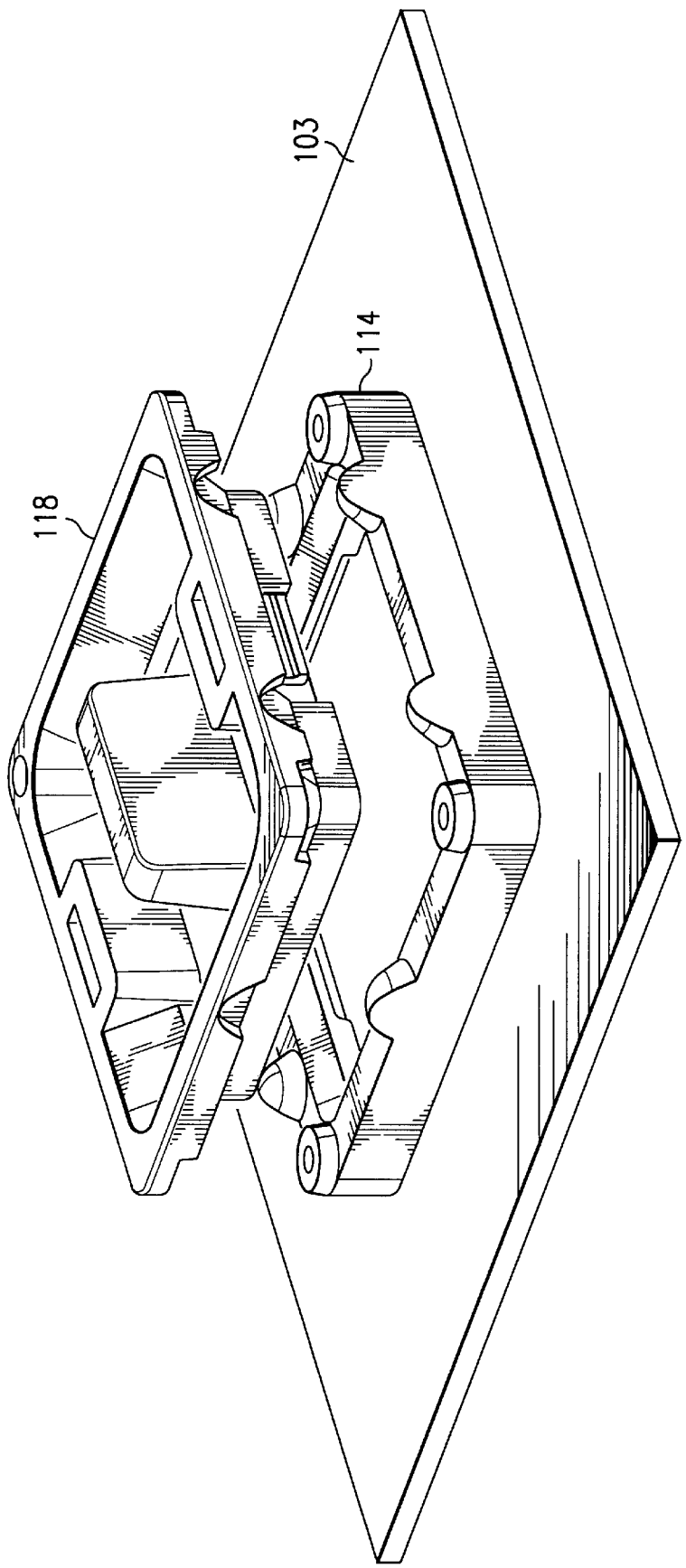
FIG. 1d is a perspective view of the anchor dust cover.

As shown in FIG. 1d, the anchor bracket 114 that is attached to the circuit board 103 may be coupled with the anchor dust cover 118. The anchor dust cover 118 protects the portion of the circuit board surrounded by the anchor bracket 114. Further, the anchor dust cover 118 reduces contamination from debris during handling and operation of the computer system.

Figure 2A:
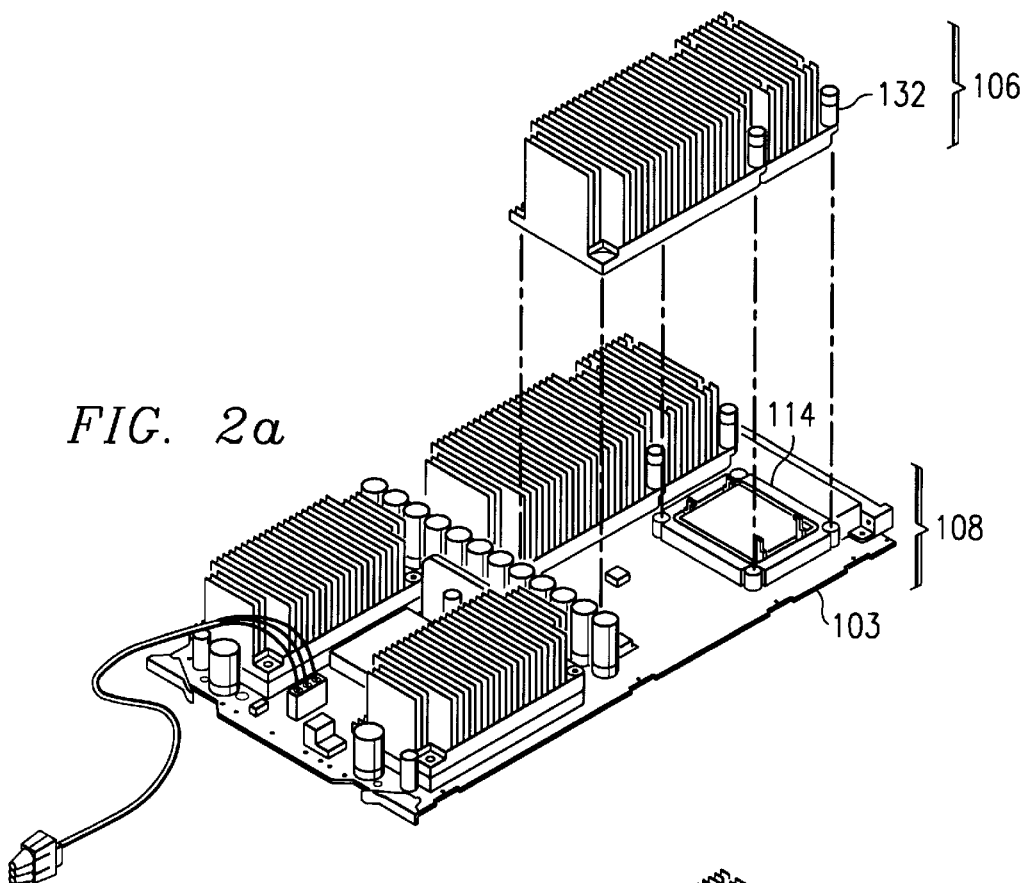
FIG. 2a is view of the field replaceable apparatus and the receiving apparatus with the anchor bracket.

As shown in FIG. 2a the computer system may be a multi-processor system and include a plurality of field replaceable apparatuses 106. Therefore the circuit board 103 may include a plurality of receiving apparatuses 108. Also, as is well known in the art, a computer system may operate without fully populating a circuit board 103 with the largest number of processors with which it may operate. Consequently, the computer system may operate for a period of time before installing a field replaceable apparatus 106 and therefore the anchor bracket 114 may include the anchor dust cover 118 (as shown in FIG. 1d) to eliminate the risk of contamination of the area on the circuit board 103 that may subsequently be connected to a processor 102.

In many computer systems the height and space constraints for processor assemblies requires insertion of the processor 102 with little or no visual access to the receiving portion of the circuit board 103. Therefore, the anchor bracket 114 enables alignment and insertion of the field replaceable apparatus 106 to the receiving apparatus 108 in a blind insertion environment. Further, the attachment of the field replaceable apparatus 106 to the anchor bracket 114 may provide stability to the circuit board 103.

The stacking of computer components also minimizes space on the circuit board 103. That is, with a tower solution for the connection of the heat sink 104 to the processor 102 (as are shown in FIG. 1a), less space on the circuit board 103 is consumed. Further, since the field replaceable apparatus 106 may be used as a handle, less access space on the circuit board 103 is required for its insertion and removal. The interposer socket 105 (as shown in FIG. 1a) does not require controlled entry to avoid pin snubbing during insertion on the circuit board 103, or to overcome large loads due to pin and socket friction. Therefore the compression and load management assembly 132 is sufficient to ensure the processor 102 is properly loaded and connected to the circuit board 103 by controlling load on the interposer socket 105 once assembly of the modular integrated apparatus 101 (as shown in FIG. 1a) is complete. This also results in a saving on computer system components such as card guides to control orientation of processor components or ejector handles to create leverage to overcome large load constraints for insertion and removal of the processor 102.

Figure 2B:
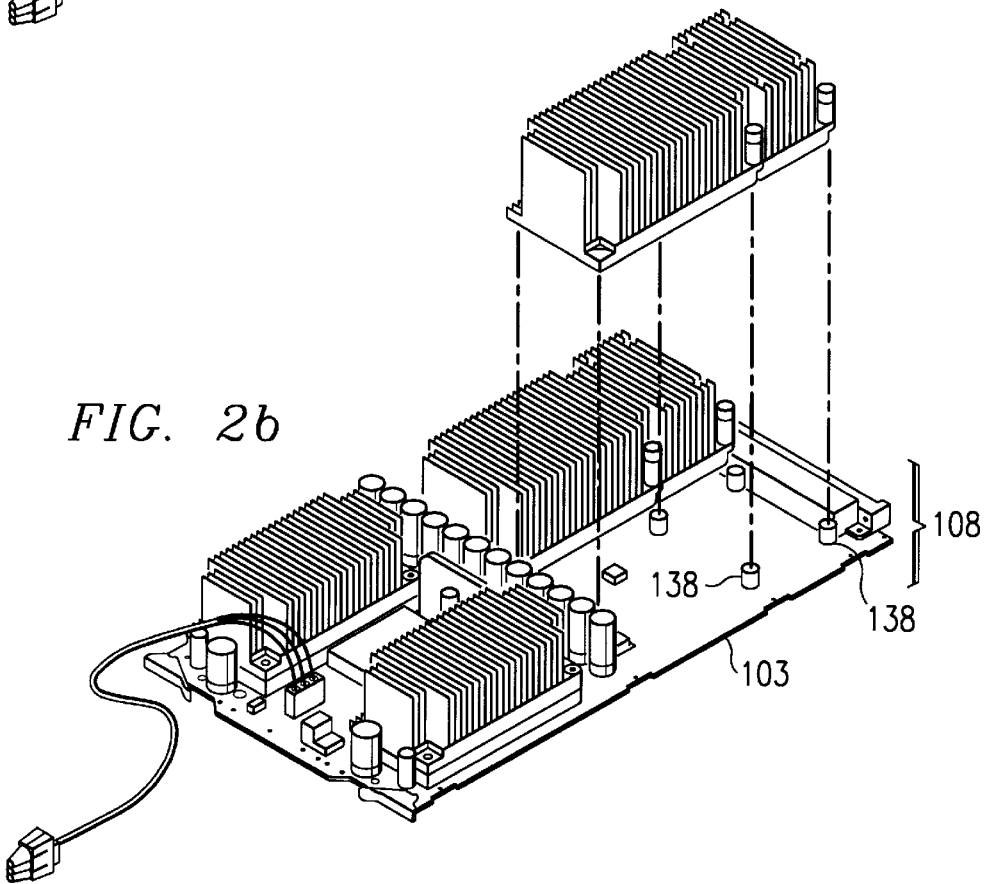
FIG. 2b is view of the field replaceable apparatus and the receiving apparatus with the circuit board sockets.

As shown in FIG. 2b, and in an alternative embodiment of the receiving apparatus 108, the function of the anchor bracket 144 (as shown in FIG. 2a) is incorporated in the support base 120 and the anchor bracket 114 may be eliminated. Therefore the support base 120 may be directly attached to the circuit board 103, and the circuit board 103 may contain at least one circuit board socket 138 to receive the threaded anchor screws 130 (as shown in FIG. 1a). Further, the support base 120 may include the EMI groove 136 (as shown in FIG. 1a) that may be used with electrically conductive material to attenuate EMI. The circuit board 103 may be bolstered by techniques well-known in the art.

Figure 3:
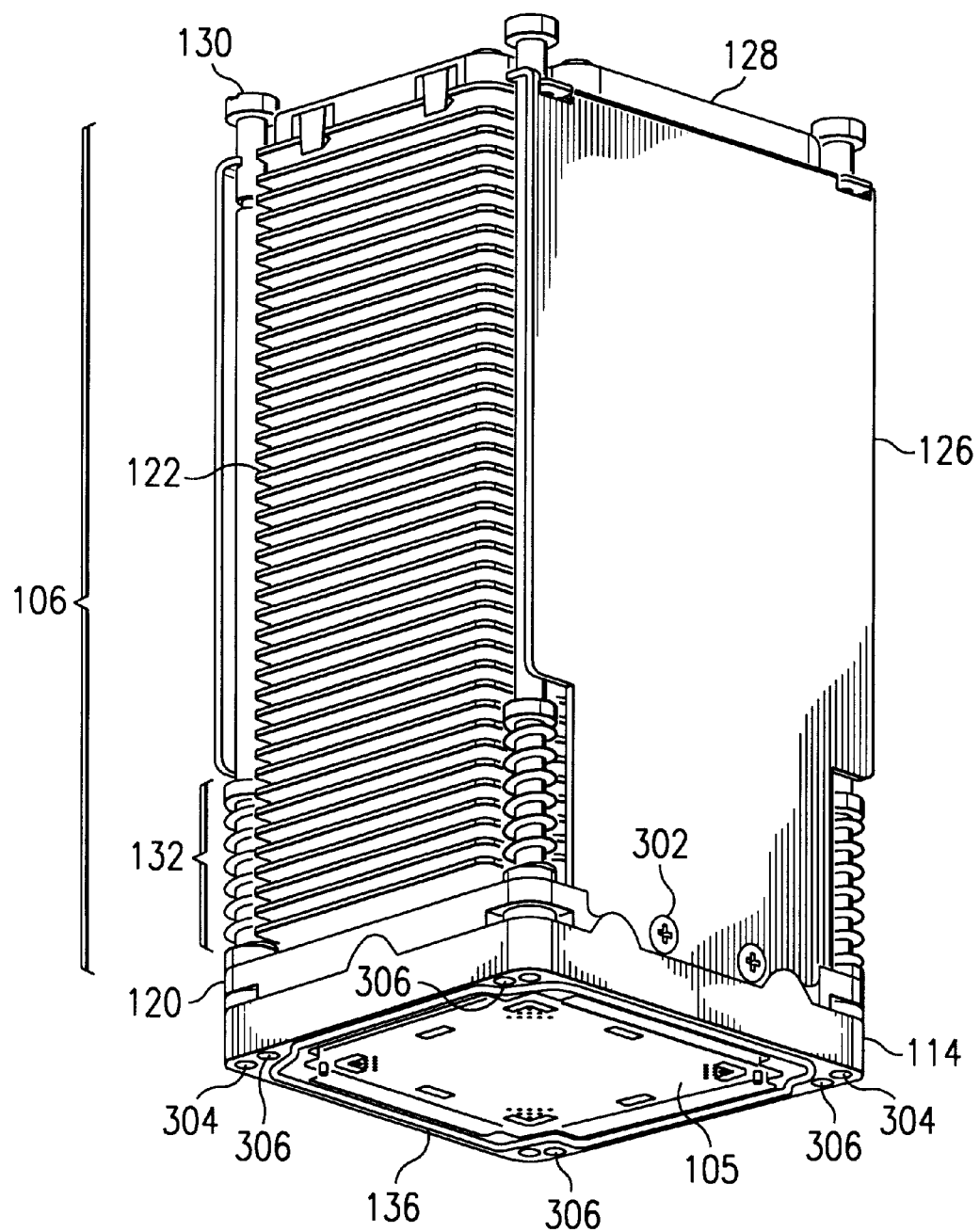
FIG. 3 is a enlarged perspective view of the lower portion field replaceable apparatus and the anchor bracket.

As shown in FIG. 3 the field replaceable apparatus 106 advantageously connects the processor 102 to the thermal plate 402 by attachment of the socket frame 110 (as are shown in FIG. 1a) to the support base 120 thereby minimizing thermal resistance. Further, the field replaceable apparatus 106 is assembled and tested in the manufacturing environment and therefore the tight thermal coupling between the processor 102 and the thermal plate 402 is established and preserved. Since the insertion and removal process in a customer environment is less intrusive when a self-contained field replaceable apparatus 106 is employed, the insertion and extraction capabilities that are fully contained within the field replaceable apparatus 106 improve its quality by reducing the risk of damage due to errors in handling.

Recall that the anchor bracket 114 is initially attached to the circuit board 103 (as shown in FIG. 2a) by screws (not shown) threaded into the anchor bracket sockets 306 thereby forming the receiving apparatus 108 (as shown in FIG. 1a). Therefore, the anchor screws 130 that terminate at the anchor sockets 304 in the anchor bracket 114 are secured to the receiving apparatus 108 and the circuit board 103. Further, the compression and load management assemblies 132 enable the anchor screws 130 to be properly tightened to a pre-determined spacer height that ensures an appropriate load on the interposer socket 105, and an EMI seal.

The embodiment may include an anchor bracket 114 that attenuates EMI emissions. Since the field replaceable apparatus 106 is tightly clamped to the circuit board 103 through the anchor bracket 114, when the anchor bracket 114 is made of EMI attenuating material it may attenuate EMI from the processor 102. The anchor bracket 114 may also be grounded to the support base 120 to attenuate EMI from the processor 102. Further, the anchor bracket 114 may have an EMI groove 136 in both the face that abuts the support base 120 and the face that abuts the circuit board 103, as is well known in the art. Therefore, coupling an electrically compliant interface, such as the EMI gasket 113 (as shown in FIG. 1a), with the EMI groove 136 will also attenuate EMI by enabling a tight connection between the anchor bracket 114 and the circuit board 103.

The heat fins 122 are covered by the side sleeve 126 which is discussed with reference to FIG. 1a. The side sleeve 126 is attached to the support base 120 by screws that thread into the support sockets 302.

Figure 4A:
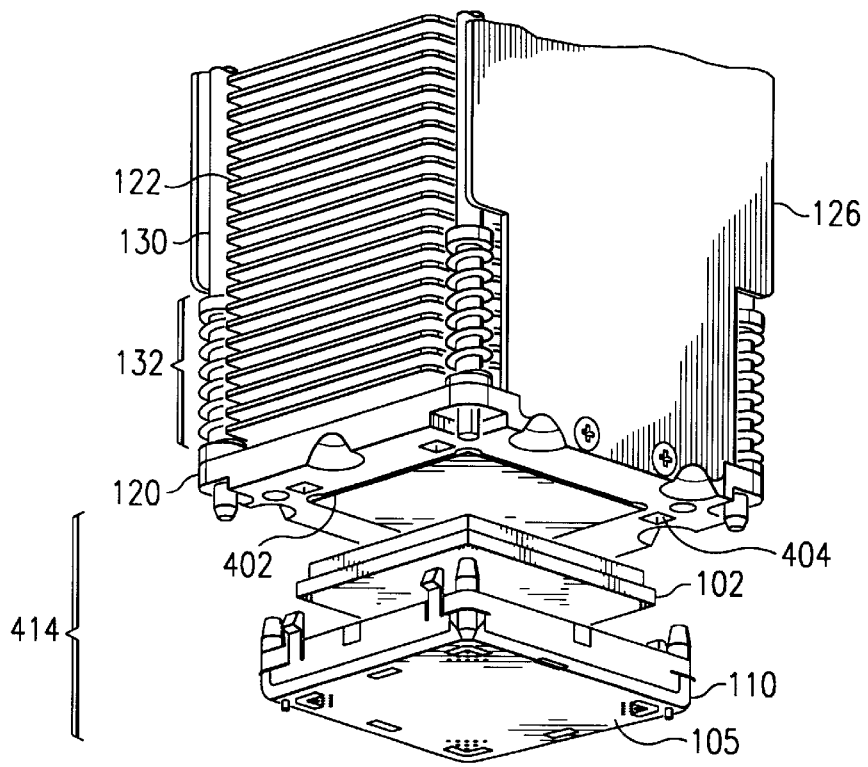
FIG. 4a is an enlarged view of the modular processor apparatus and portions of the heat sink including the heat fins.
Figure 4B:
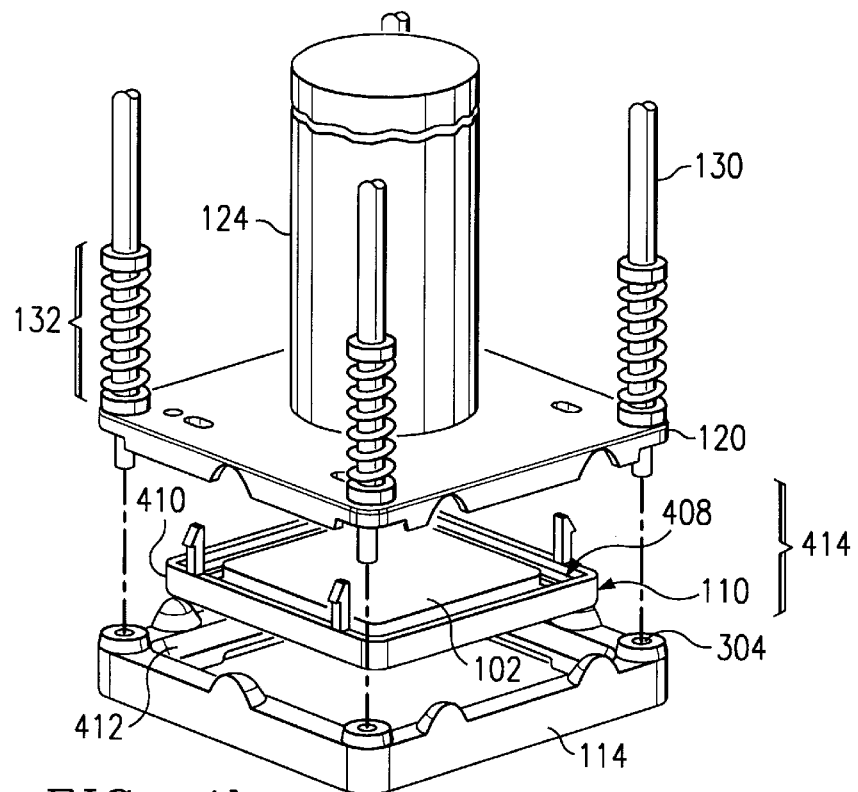
FIG. 4b is an enlarged view of the modular processor apparatus, portions of the heat sink including the heat pipe, the compression and load management assembly, and the anchor bracket.

FIG. 4a shows an enlarged view of the modular processor apparatus 414 and portions of the heat sink 104 including the heat fins 122. The interposer sockets 105 may be attached to the socket frame 110 with adhesive or may rest on a pre-formed edge in the socket frame 110. The socket frame 110 and the processor 102 may be formed to ensure that the processor 102 will fit into the socket frame 110 in only the correct orientation. For instance, as is well known in the art, the socket frame 110 may have one comer that is chamfered, with a forty-five degree break in an otherwise sharp comer. The processor 102 may be formed to mate with the chamfered comer of the socket frame 110 so that the socket frame 110 will only fit with the processor 102 in one position. The socket frame 110 may be a plastic molded part that protects the processor 102 after it has been connected to the socket frame 110.

The socket frame 110 may have molded features that allow it to be snapped by hand onto receiving sockets 404 in the support base 120. Further, the socket frame 110 may include tapered alignment pins (not shown) or other well known solutions that ensure that the attachment of the socket frame 110 to the support base 120 is in the proper position. Further, by the encasement of the processor 102 inside the socket frame 110, the processor is properly aligned to mate with the interposer sockets 105. Additionally, the alignment of the socket frame 110 to the support base 120 ensures that the interposer sockets 105 are properly oriented and positioned to mate with the LGA of the circuit board 103 (as shown in FIG. 1a). Finally, when the field replaceable apparatus 106 is attached to the receiving apparatus 108 (as are shown in FIG. 1a) the alignment of the socket frame 110 to the receiving apparatus 108 ensures that the interposer sockets 105 properly connect to the LGA of the circuit board 103.

The attachment of the socket frame 110 to the support base 120, and the application of the thermal interface material (not shown) between the thermal plate 402 and the processor 102 ensures a tight thermal coupling once the field replaceable apparatus 106 is attached to the receiving apparatus 108 and the processor 102 is under the proper load. It will be appreciated that the thermal interface material may be an easy to use pad that enhances heat transfer such as the product released under the trademark THERMSTRATE®. Successful application of the thermal interface material requires a flat, clean, smooth surface between the processor 102 and the thermal plate 402 and may be difficult to apply outside of the manufacturing environment.

The socket frame 110 includes the processor dust cover 112 (as shown in FIG. 1c). The introduction of debris to the connection of the processor 102 and the circuit board 103 may impede the electrical connection between the processor 102 and the circuit board 103 thereby impairing the function of the processor 103. More particularly, the contacts on the interposer sockets 105 are sensitive to contamination at the connection point to the circuit board 103, which may cause a bad electrical connection. Therefore the processor dust cover 112 protects the processor 102 from debris and possible damage. When the field replaceable apparatus 106 is installed the processor dust cover 112 can be easily removed thereby exposing the interposer sockets 105 that have been protected from debris.

FIG. 4a further shows the heat fins 122, the side sleeve 126, the anchor screws 130, and the compression and load management assembly 132. It will be appreciated that the anchor screws 130 travel through the support base 120 and terminate in the circuit board 103 or the anchor bracket 114 (as are shown in FIG. 1a).

FIG. 4b is an enlarged view of the modular processor apparatus 414 and portions of the heat sink 104 including the heat pipe 124. The processor 102 may be surrounded by edges of the socket frame 110 that may include duel cantilevered beams 408, and the processor 102 may be designed to fit into the duel cantilevered beams 408, thereby aligning the land grid array of the processor 102 and the interposer sockets 105 on the socket frame 110.

In an alternative optional embodiment the processor 102 may be designed with an overhang on its lid that rests on a recessed edge of the socket frame 110. More particularly, the edges of the socket frame 110 may be recessed and fit into the overhang of the processor 102, as is discussed in the associated U.S. patent application Ser. No. 09/032359.

The anchor bracket 114 may have tapered alignment pins (not shown) or by any other well known technique may ensure alignment of the socket frame 110 to the anchor bracket 114 or the anchor bracket 114 to the circuit board 103. For example, the alignment may result in proper positioning of the anchor bracket 114 to the socket frame 110. Therefore, the proper position of the interposer sockets 105 to the circuit board 103 is ensured.

In an optional alternative embodiment, by employing a first alignment surface 410 on the socket frame 110 and a second alignment surface 412 on the anchor bracket 114, the socket frame 110 may be positioned to cooperate with the anchor bracket 114 and thereby may align the processor 102 to easily connect to the circuit board 103. The coupling of the first alignment surface 410 on the socket frame 110 to the second alignment surface 412 on the anchor bracket 114 enables the correct positioning of the processor 102 on the printed circuit board as is discussed with reference to U.S. patent application Ser. No. 09/032359. In yet another optional alternative embodiment, the support base 120 may have alignment surfaces (not shown) that mate with alignment surfaces of the anchor bracket to ensure the correct alignment of the modular processor apparatus 414 and thereby to properly position the processor 102 for connection on the circuit board 103.

The heat sink 104 (a shown in FIG. 1a) includes the heat pipe 124 that is attached to the thermal plate 402 (as shown in FIG. 4a) and that may be made of copper and contain water that undergoes a phase change when the evaporating end of the heat pipe 124 is heated. Thereby fluid vapor moves through the heat pipe 124 as heat is transferred through the thermal plate 402 as is well known in the art.

The anchor screws 130 and the compression and load management assembly 132 cooperate to ensure that the proper load is achieved on the processor 102 when the anchor screws 130 are set into the anchor sockets 304.

The present embodiment is a modular integrated apparatus and method that integrates mechanical, electrical, and thermal management, and that includes a processor coupled to a thermal plate and connected to a circuit board. Further, the modular integrated apparatus includes a field replaceable apparatus and a receiving apparatus and attenuates EMI.

By integrating mechanical, electrical, and thermal management features the present embodiment improves the process of repairing and upgrading the processor at a customer site by simplifying the computer apparatus package. Additionally, by reducing the number of parts and the amount of circuit board space required to attach a processor to a support base, the present embodiment improves ease of use and acts as a handle in its own installation and removal on the circuit board. Further, by including the processor and a heat sink in the field replaceable apparatus, the field replaceable apparatus reduces risk of damage to the processor and may be tested prior to installation in the field to ensure it operates properly.

Although a specific embodiment of the invention has been described and illustrated, the invention is not to be limited to the specific forms or arrangement of parts so described and illustrated. Those skilled in the art will recognize that changes may be made in form and detail without departing from the scope of the invention. The invention is limited only by the claims.

We claim:

1. A modular integrated apparatus comprising;

a circuit board having electric power;

a field replaceable apparatus having:

a modular processor apparatus having:

processor;

a landgrid array interposer socket;

a socket frame that attaches to said landgrid array interposer socket;

said land grid array interposer socket enabling electrical connection between said circuit board and said processor, and said processor fitting into said socket frame;

a support base attached to said socket frame thereby positioning said modular processor apparatus for connection of said processor to said circuit board; and a non-thermal component connected to said support base thereby adapting said field replaceable apparatus as a handle for insertion and removal of said field replaceable apparatus to and from said circuit board thereby facilitating handling of said field replaceable apparatus at a customer's site;

at least one anchor screw; and said circuit board having at least one socket and attaching to said field replaceable apparatus through said socket by said anchor screw thereby assembling said modular integrated apparatus so that said processor electrically connects to said circuit board.

2. A modular integrated apparatus comprising;

a circuit board having electric power;

a field replaceable apparatus having:
- a modular processor apparatus having:
  - a processor;
  - a landgrid array interposer socket;
  - a socket frame that attaches to said landgrid array interposer socket;
  - said land grid array interposer socket enabling electrical connection between said circuit board and said processor; and
  - said processor fitting into said socket frame;
- a support base attached to said socket frame thereby positioning said modular processor apparatus for connection of said processor to said circuit board; and
- a heat sink connected to said support base so that said modular processor apparatus thermally couples to said heat sink with a sufficiently low resistance thermal path to manage heat for said processor; and said circuit board attaching to said field replaceable apparatus thereby assembling said modular integrated apparatus so that said processor electrically connects to said circuit board.

3. The modular integrated apparatus as set forth in claim 2 further comprising; a receiving apparatus having said circuit board and an anchor bracket attached to said circuit board and said field replaceable apparatus being attached to said receiving apparatus thereby connecting said modular processor apparatus to said circuit board so that said processor electrically connects to said circuit board.

4. The modular integrated apparatus as set forth in claim 2 further comprising;

wherein said field replaceable apparatus having a top cover being attached to said heat sink;

at least one anchor screw that enters said field replaceable apparatus alongside said top cover and that is attached to said anchor bracket of said receiving apparatus; and at least one compression and load management assembly that manages mechanical load on said processor from the attachment by said anchor screw during connection of said processor to said circuit board thereby facilitating assembly of said modular integrated apparatus at a customer's site.

5. The modular integrated apparatus as set forth in claim 2, wherein said field replaceable apparatus further comprises a side sleeve attached to said support base and covering at least two sides of said heat sink thereby supporting said field replaceable apparatus for support and ease of handling of said field replaceable apparatus.

6. The modular integrated apparatus as set forth in claim 2, wherein said field replaceable apparatus is adapted as a handle for insertion and removal of said field replaceable apparatus to and from said circuit board thereby facilitating handling of said field replaceable apparatus at a customer's site.

7. A modular integrated apparatus comprising;

a circuit board having electric power;

a field replaceable apparatus having:
- a modular processor apparatus having:
  - a processor;
  - a landgrid array interposer socket;
  - a socket frame that attaches to said landgrid array interposer socket;
  - said landgrid array interposer socket enabling electrical connection between said circuit board and said processor; and
  - said processor fitting into said socket frame;
- a support base attached to said socket frame thereby positioning said modular processor apparatus for connection of said processor to said circuit board; and
- a non-thermal component connected to said support base adapting said field replaceable apparatus as a handle for insertion and removal of said field replaceable apparatus to and from said circuit board thereby facilitating handling of said field replaceable apparatus at a customer's site; and a receiving apparatus having said circuit board and an anchor bracket attached to said circuit board and said field replaceable apparatus being attached to said anchor bracket thereby connecting said modular processor apparatus to said circuit board so that said processor electrically connects to said circuit board.

* * * * *